United States Patent
Nakayama et al.

(10) Patent No.: US 8,120,021 B2
(45) Date of Patent: Feb. 21, 2012

(54) DISPLAY DEVICE AND METHOD FOR MANUFACTURING DISPLAY DEVICE

(75) Inventors: Tetsuo Nakayama, Tokyo (JP); Takanori Shibasaki, Kanagawa (JP); Nobuo Ozawa, Kanagawa (JP); Eisuke Matsuda, Kanagawa (JP); Takashi Hirano, Kanagawa (JP); Tadashi Ishibashi, Aichi (JP); Yoichi Tomo, Kanagawa (JP); Keisuke Matsuo, Kanagawa (JP)

(73) Assignee: Sony Corporation, Tokyo (JP)

( * ) Notice: Subject to any disclaimer, the term of this patent is extended or adjusted under 35 U.S.C. 154(b) by 232 days.

(21) Appl. No.: 12/645,635

(22) Filed: Dec. 23, 2009

(65) Prior Publication Data

US 2010/0097411 A1    Apr. 22, 2010

Related U.S. Application Data

(62) Division of application No. 11/463,796, filed on Aug. 10, 2006, now Pat. No. 7,666,707.

(30) Foreign Application Priority Data

Aug. 17, 2005 (JP) .................. 2005-236298

(51) Int. Cl.
*H01L 29/08* (2006.01)
*H01L 35/24* (2006.01)
*H01L 51/00* (2006.01)

(52) U.S. Cl. .............. 257/40; 257/E51.001; 438/29; 438/99

(58) Field of Classification Search ............. 257/40, 257/E51.001; 438/29, 99
See application file for complete search history.

(56) References Cited

U.S. PATENT DOCUMENTS

| | | | |
|---|---|---|---|
| 6,025,252 | A | 2/2000 | Shindo et al. |
| 6,995,035 | B2 | 2/2006 | Cok et al. |
| 7,247,986 | B2 | 7/2007 | Kang et al. |
| 2004/0253756 | A1 | 12/2004 | Cok et al. |
| 2007/0048886 | A1 | 3/2007 | Winters et al. |

FOREIGN PATENT DOCUMENTS

| | | |
|---|---|---|
| JP | 2002-352963 | 12/2002 |
| JP | 2004-071551 | 3/2004 |
| JP | 2004-165068 | 6/2004 |
| JP | 2005-011810 | 1/2005 |
| JP | 2005-019211 | 1/2005 |
| JP | 2005011810 | 1/2005 |
| JP | 2005-116507 | 4/2005 |

OTHER PUBLICATIONS

"The International Dictionary of Physics and Electronics"; 1961; Second Edition; D. Van Nostrand Company (Canada), Ltd.; pp. 39-41.

*Primary Examiner* — Stephen W Smoot
*Assistant Examiner* — Vicki B Booker
(74) *Attorney, Agent, or Firm* — K&L Gates LLP (57) ABSTRACT

A display device and a method for manufacturing the display device are provided. The display device includes an organic layer on an auxiliary wiring is removed with high precision by one operation and, thereby, the yield and the productivity are improved. A lower electrode is formed by patterning in each pixel on a substrate. An auxiliary wiring including a light absorption layer is formed between individual pixels. An organic layer is formed on the substrate while covering the lower electrodes. Laser irradiation is conducted from the organic layer side, the laser light is converted to heat in the light absorption layer exposed at a portion under the organic layer, and the organic layer portion above the light absorption layer is removed selectively. An upper electrode is formed on the organic layer and is connected to the light absorption layer portion of the auxiliary wiring.

6 Claims, 7 Drawing Sheets

DISPLAY DEVICE AND METHOD FOR MANUFACTURING DISPLAY DEVICE

CROSS REFERENCES TO RELATED APPLICATIONS

The present application is a divisional of U.S. patent application Ser. No. 11/463,796 filed on Aug. 10, 2006 which claims priority to Japanese Patent Application No. 2005-236298 filed in the Japanese Patent Office on Aug. 17, 2005, the entire contents of which are incorporated herein by reference.

BACKGROUND

The present application relates to a method for manufacturing a display device and to a display device. In particular, it relates to a method for manufacturing a display device, in which a plurality of organic electroluminescent elements are disposed, and a display device produced by this method.

An organic electroluminescent element taking advantage of electroluminescence (EL) of an organic material (so-called organic electroluminescent element) is configured by holding an organic layer, which is a laminate of a hole transporting layer, a light emitting layer, and the like, between a lower electrode and an upper electrode, and has been noted as a light emitting element capable of emitting high luminance light by low voltage direct current driving. A display device including such an organic electroluminescent element (hereafter simply referred to as a display device) is an excellent flat panel type display device and has been developed toward the scale-up of screen from the viewpoint of the color reproducibility and the response speed.

The above-described display device is allowed to deliver higher performance on the basis of active matrix drive by including thin film transistors (TFTs) to drive organic electroluminescent elements. In the active matrix-driven display device, an interlayer insulation film is disposed covering TFTs, and organic electroluminescent elements are disposed on the interlayer insulation film. Lower electrodes of individual organic electroluminescent elements are formed on the interlayer insulation film by patterning on a pixel basis while being connected to the TFTs. An organic layer of the organic electroluminescent elements is disposed on these lower electrodes. An upper electrode is disposed as a solid film common to organic electroluminescent elements of individual pixels, while organic layers are held between the lower electrodes and the upper electrode.

For the above-described active matrix-driven display device, a so-called top emission type, in which the emitted light is taken out from the side opposite to a substrate provided with the TFT, is effective at ensuring an aperture ratio. In this case, it is desired that the upper electrode is formed from a transparent material or a translucent material. However, the upper electrode including such a material as a solid film common to individual pixels has a high resistance value and display quality is significantly deteriorated due to a voltage drop. Consequently, the resistance of the upper electrode is reduced by forming an auxiliary wiring between pixels as the same layer with the lower electrode and connecting the upper electrode to the auxiliary wiring.

However, as pixel sizes and pixel pitches have been made finer in recent years, organic layers are formed having different colors on a pixel corresponding to each color of RGB basis, and tend to significantly extend in between pixels and cover the auxiliary wiring. In the configuration in which the organic layer is formed as a solid film common to individual pixels in consideration of the limit of differentiation in colors of the organic layers due to the above-described miniaturization, all over the surface of the auxiliary wiring is covered with the organic layer. In this case, the contact between the auxiliary wiring and the upper electrode becomes poor due to the organic layer on the auxiliary wiring.

Consequently, a method in which the organic layer on the auxiliary wiring has been removed by ablation through laser irradiation has been proposed. In this case, the irradiation portion of the laser light (radiant ray) is set by using a mask having an opening at the position corresponding to the auxiliary wiring, and the organic layer portion on the auxiliary wiring is selectively ablated. Alternatively, the laser light is applied after being aligned with the auxiliary wiring and, thereby, the organic layer portion on the auxiliary wiring is selectively ablated (refer to Japanese Unexamined Patent Application Publication No. 2005-11810, in particular, paragraphs [0031] and [0032]).

However, according to the above-described method disclosed by Japanese Unexamined Patent Application Publication No. 2005-11810, a misalignment between the auxiliary wiring and the mask opening and a misalignment between the auxiliary wiring and the position of the laser irradiation tend to occur, and a reduction of the yield results. In particular, in the method in which a mask is used, the production cost is increased due to the use of the mask. In the method in which the laser light is applied after being aligned with the auxiliary wiring, an operation time is increased as compared with that of the laser irradiation by one operation and, therefore, the production efficiency is reduced.

It is desired to provide a method for manufacturing a display device provided with organic electroluminescent elements and a display device produced by the method, wherein an organic layer on an auxiliary wiring is removed with high precision by one operation and, thereby, the yield is improved and the productivity is improved.

SUMMARY

According to an embodiment, a display device, in which a plurality of organic electroluminescent elements including an organic layer held between a lower electrode and an upper electrode are disposed on a substrate, is provided. The display device includes the lower electrode disposed by patterning in each pixel on the substrate and an auxiliary wiring disposed between pixels on the substrate. Among them, the auxiliary wiring includes a light absorption layer formed from an electrically conductive material having a light absorption coefficient higher than that of the lower electrode. The organic layer is disposed on the substrate including the lower electrodes and the auxiliary wiring, while covering the lower electrode and exposing the light absorption layer portion of the auxiliary wiring. Furthermore, the upper electrode is disposed on this organic layer, while the above-described organic layer is held between the lower electrode and the upper electrode and the upper electrode is connected to the above-described light absorption layer constituting the auxiliary wiring and being exposed at the organic layer.

According to an embodiment, a method for manufacturing a display device is provided, and the following procedures are carried out. The lower electrode is formed by patterning in each pixel on the substrate. In addition, an auxiliary wiring is formed between individual pixels on the substrate, the auxiliary wiring including a light absorption layer formed from an electrically conductive material having a light absorption coefficient higher than that of the lower electrode. The organic layer is formed on the substrate including the lower electrodes and the auxiliary wiring, while covering at least the lower electrodes. Laser irradiation is conducted from the organic layer side, the laser light is converted to heat in the light absorption layer exposed at a portion under the organic layer, and the organic layer portion above the light absorption layer is removed selectively. Subsequently, the upper electrode is formed on the substrate in such a way that the organic layer is held between the lower electrode and the upper electrode and the upper electrode is connected to the light absorption layer portion, from which the organic layer has been removed, of the auxiliary wiring.

In the above-described embodiments, the lower electrode and the auxiliary wiring disposed under the organic layer have different configurations. In the auxiliary wiring, the light absorption layer formed from an electrically conductive material having the light absorption coefficient higher than that of the lower electrode is disposed, and this light absorption layer is exposed. In this manner, the light applied from the exposure side of the light absorption layer is not absorbed by the lower electrode, but is simply absorbed by the light absorption layer of the auxiliary wiring so as to be converted to the heat. The organic layer on the auxiliary wiring (light absorption layer) is removed by the resulting heat. That is, the organic layer on the light absorption layer constituting the auxiliary wiring is selectively removed with high precision and without misalignment relative to the auxiliary wiring not by conducting selective light irradiation, but by conducting light irradiation all over the surface. Consequently, the upper electrode is connected simply to the portion, from which the organic layer has been removed, of the auxiliary wiring.

As described above, according to the embodiments, since it is possible to remove selectively the organic layer on the auxiliary wiring with high precision not by conducting selective light irradiation, but by conducting light irradiation all over the surface, it becomes possible to improve the yield and improve the productivity in the production of a display device including the organic electroluminescent elements in which a voltage drop of the upper electrode is prevented by connecting the auxiliary wiring.

Additional features and advantages are described herein, and will be apparent from, the following Detailed Description and the figures.

DETAILED DESCRIPTION

Embodiments will be described below in detail with reference to the drawings.

First Embodiment

Figure 1:
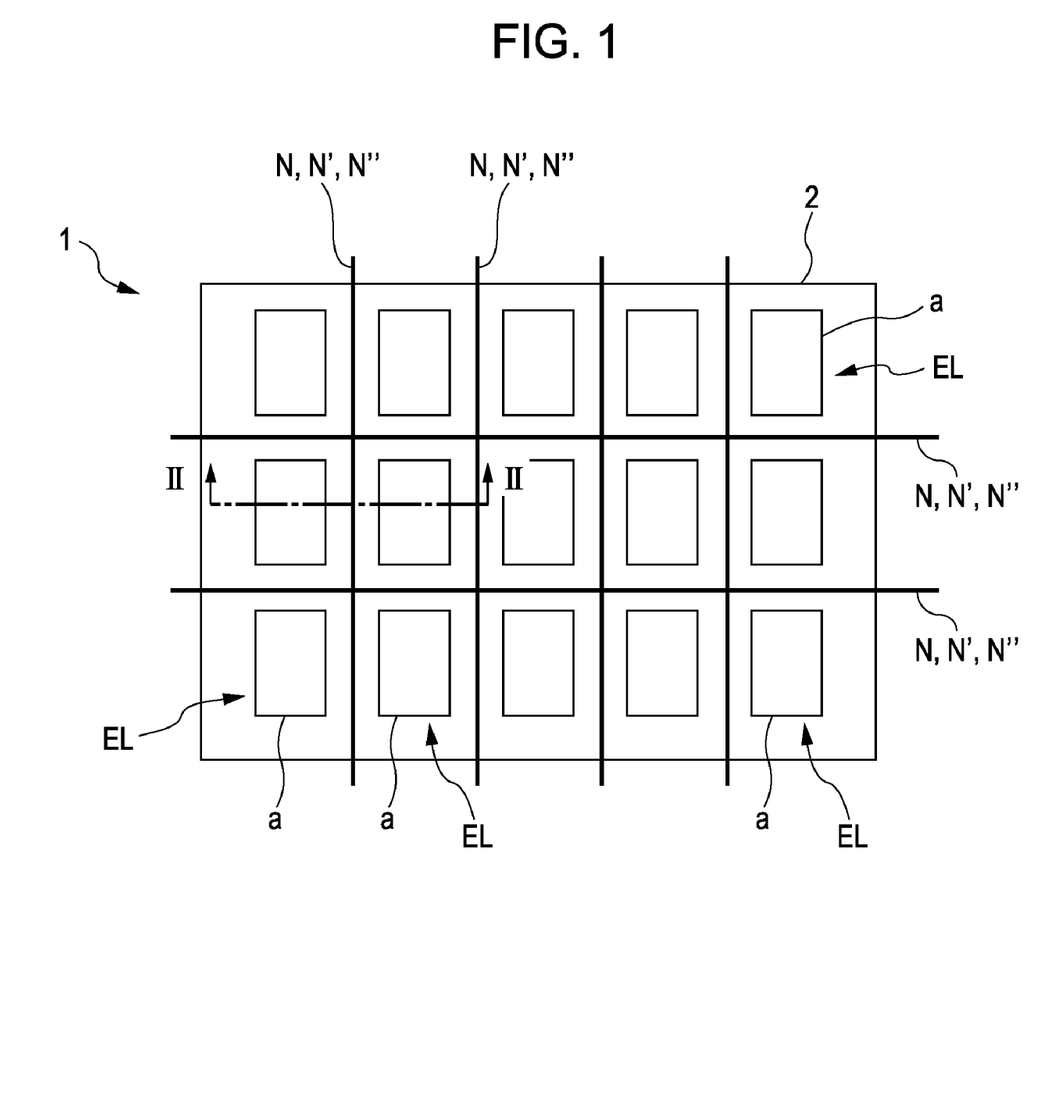
FIG. 1 is a schematic plan view for explaining a display device according to an embodiment.

FIG. 1 is a schematic plan view for explaining a display device according to a first embodiment. A display device 1 shown in the drawing is an active matrix-driven display device, and a plurality of organic electroluminescent elements EL are disposed in corresponding to individual pixels a on a substrate 2. An auxiliary wiring N connected to organic electroluminescent elements EL is disposed between individual pixels a, as described below.

Figure 2:
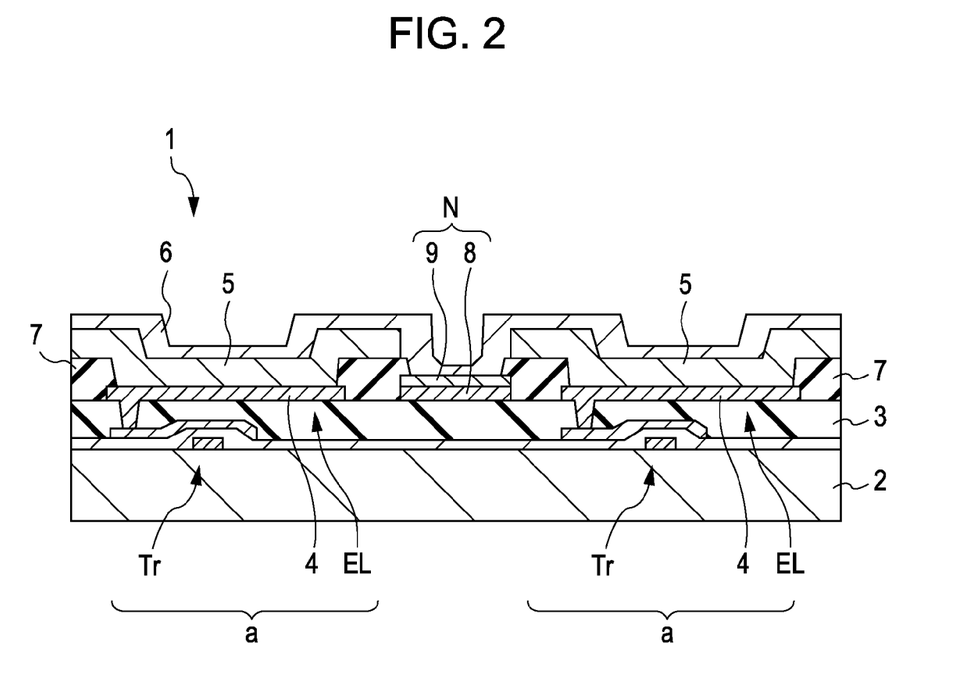
FIG. 2 is a schematic sectional view for explaining the configuration of a display device according to a first embodiment.

FIG. 2 is a schematic sectional view for explaining the configuration of the display device 1 according to the first embodiment, and is corresponding to a section II-II shown in FIG. 1.

As shown in FIG. 2, pixel circuits provided with thin film transistors Tr, capacitative elements (not shown), and the like are disposed on the substrate 2, and an interlayer insulation film 3 is disposed covering the pixel circuits. Organic electroluminescent elements EL are disposed on the interlayer insulation film 3.

Each organic electroluminescent element EL is provided with a lower electrode 4 connected to the thin film transistor Tr through a contact hole disposed in the interlayer insulation film 3, an organic layer 5 covering the lower electrode 4, and an upper electrode 6 covering the organic layer 5 and being disposed commonly to organic electroluminescent elements EL of individual pixels a. The lower electrode 4 is used as, for example, an anode (or a cathode), and has been patterned as a pixel electrode configured by using a material having good reflection characteristics. The periphery of each lower electrode 4 is covered with an insulating film pattern 7, and the center portion is in the state of being exposed widely. A portion, which is exposed at the insulating film pattern 7, of the lower electrode 4 serves as a light emitting portion, for example, a portion corresponding to the pixel a here. The upper electrode 6 is used as, for example, a cathode (or an anode), and is formed taking the shape of a solid film as an electrode common to individual organic electroluminescent elements EL. The upper electrode 6 is formed having a light transmission property and, thereby, the resulting organic electroluminescent element EL is configured to be of upper surface light emission type, in which the emitted light is taken out from the upper electrode 6 side.

The auxiliary wiring N, which is the same layer as the lower electrode 4, is disposed between the pixels a provided with the organic electroluminescent elements EL having the above-described configuration. In the first embodiment, the auxiliary wiring N is composed of a highly electrically conductive layer 8 formed from the same material as that for the lower electrode 4 and a light absorption layer 9 laminated on the highly electrically conductive layer 8 and exposed. It is desirable that the light absorption layer 9 is formed from a material having the light absorption property higher than that of the lower electrode 4 and the highly electrically conductive layer 8 and having a good photo-thermal conversion efficiency.

Since the light absorption coefficient of the lower electrode 4 and that of the light absorption layer 9 are differentiated, when the laser light is applied, the laser light is absorbed and converted to heat in the light absorption layer 9, and the organic layer 5 is removed due to the resulting heat generation. However, the heat generation is suppressed in the lower electrode 4. In the upper surface light emission type display device 1, a material having excellent reflection characteristics is used as the lower electrode 4. Therefore, in many cases, the light absorption coefficient of the lower electrode 4 is on the order of a few percent, and it is preferable that a material having a light absorption coefficient of at least about 10% is used as the light absorption layer 9. That is, when the laser light is applied, it is important that the laser light is absorbed and converted to heat in the light absorption layer 9, and the organic layer 5 is removed due to the resulting heat generation, while the heat generation is suppressed in such a way as to leave the organic layer 5 on the lower electrode 4. For this reason, it is preferable that the lower electrode 4 and the light absorption layer 9 are configured by using materials having different photo-thermal conversion efficiencies. Since the display device 1 is of upper surface light emission type, a material having good reflection characteristics and good electrical conductivity is used for the lower electrode 4.

Specifically, metals, e.g., molybdenum, nickel, chromium, and titanium, and alloys thereof are used as the material for constituting the light absorption layer 9. On the other hand, metals, e.g., silver, aluminum, gold, and platinum, and alloys thereof are used as the material for constituting the lower electrode 4 (furthermore, highly electrically conductive layer 8).

The insulating pattern 7 covering the perimeter of the lower electrode 4 is formed by patterning into the shape suitable for exposing the auxiliary wiring N. Furthermore, the organic layer 5 is disposed in such a way as to expose at least a part of the auxiliary wiring N, specifically, the light absorption layer 9 constituting the auxiliary wiring N. The upper electrode 6 is connected to a portion, which is exposed at the organic layer 5 and the insulating pattern 7, of the auxiliary wiring N, that is, the light absorption layer 9 of the auxiliary wiring N.

A method for manufacturing the display device 1 having such a configuration will be described below in detail with reference to sectional step diagrams shown in FIGS. 3A to 3D and FIGS. 4E and 4F.

Figure 3A:
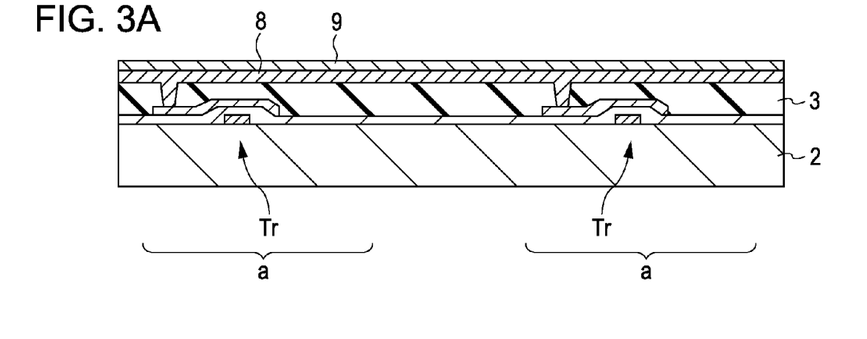
FIGS. 3A to 3D are sectional step diagrams showing a method for manufacturing the display device according to the first embodiment.

As shown in FIG. 3A, pixel circuits provided with thin film transistors Tr, capacitative elements, although not shown in the drawing, and the like are disposed in individual pixels a on the substrate 2 by a general process. The interlayer insulation film 3 having a flat surface is formed from an organic material, e.g., polyimide, or a silicon based inorganic insulating film while covering the thin film transistors Tr. After the film formation, contact holes reaching the thin film transistors Tr are formed by a general lithography step.

The highly electrically conductive layer 8 is formed on the interlayer insulation film 3 by a sputtering method. The highly electrically conductive layer 8 is a film constituting the lower electrode, and a material having good electrical conductivity as well as good reflection characteristics is used. For example, metals, e.g., silver, aluminum, gold, and platinum, and alloys thereof are used. Here, the highly electrically conductive layer 8 is formed by using a silver alloy, as an example. The highly electrically conductive layer 8 is formed to connect to the thin film transistor Tr through the connection hole in the interlayer insulation film 3.

The light absorption layer 9 is formed on the highly electrically conductive layer 8 by the sputtering method. An electrically conductive material having a light absorption coefficient higher than that of the highly electrically conductive layer 8 is used for the light absorption layer 9. For example, metals, e.g., molybdenum, nickel, chromium, and titanium, and alloys thereof are used. Here, the light absorption layer 9 is formed by using molybdenum, as an example.

Figure 3B:
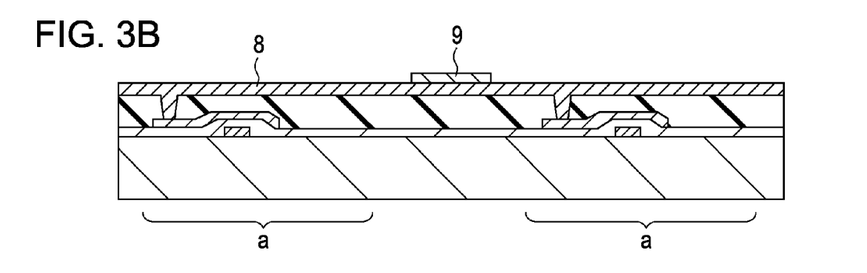

As shown in FIG. 3B, the light absorption layer 9 on the highly electrically conductive layer 8 is patterned, so that the light absorption layer 9 is left simply in between the pixels a. At this time, the light absorption layer 9 is pattern-etched by using a resist pattern as a mask, although not shown in the drawing. The pattern etching is conducted by dry etching or wet etching. The dry etching is used here. In this case, $CF_4/O_2$ is used as an etching gas. After the etching is finished, the resist pattern is removed.

Figure 3C:
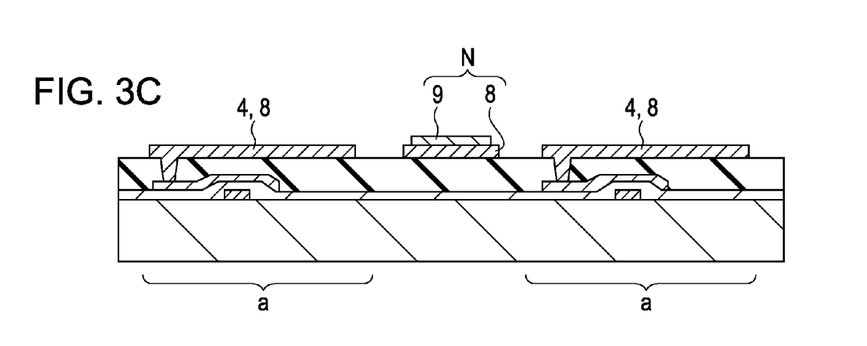

As shown in FIG. 3C, the highly electrically conductive layer 8 is patterned and, thereby, the lower electrode 4 in the shape corresponding to the pixel a is formed. By this patterning, the highly electrically conductive layer 8 in the shape of the auxiliary wiring N is left in between the pixels a while being insulated from the lower electrode 4 formed from the highly electrically conductive layer 8. At this time, the highly electrically conductive layer 8 is pattern-etched by using a resist pattern as a mask, although not shown in the drawing. The pattern etching is conducted by dry etching or wet etching. The wet etching is used here. In this case, a mixed acid is used as an etchant. After the etching is finished, the resist pattern is removed. Since the lower electrode 4 and the highly electrically conductive layer 8, which is a part of the auxiliary wiring N, are specified to be the same layer, as described above, addition of a step is suppressed.

In this manner, the auxiliary wiring N composed of the highly electrically conductive layer 8 and the light absorption layer 9 laminated thereon are formed. The wiring shape of the auxiliary wiring N is maintained by the highly electrically conductive layer 8 serving as the lower layer, and the light absorption layer 9 is laminated on at least a part of the highly electrically conductive layer 8.

For the auxiliary wiring N composed of the highly electrically conductive layer 8 and the light absorption layer 9 thereon, it is beneficial that the wiring shape of the auxiliary wiring N is maintained by the highly electrically conductive layer 8 and the light absorption layer 9, and the entire portion is not necessarily a laminate. However, this is preferable because the resistance of the auxiliary wiring N is kept at low when the wiring shape of the auxiliary wiring N is maintained by the highly electrically conductive layer 8. The light absorption layer 9 is not necessarily patterned into a continuous wiring shape of the auxiliary wiring N. It is beneficial that the light absorption layer 9 is disposed simply at portions where the auxiliary wiring N is connected to the upper electrode, as described below.

The formation procedure of the lower electrode 4 and the auxiliary wiring N is not limited to the above-described steps explained with reference to FIGS. 3A to 3C, as long as the above-described configuration is ensured. For example, the lower electrodes 4 and the highly electrically conductive layers 8 of the auxiliary wiring N may be formed by patterning in the same step and, thereafter, the light absorption layers 9 of the auxiliary wiring N may be formed by patterning.

Figure 3D:
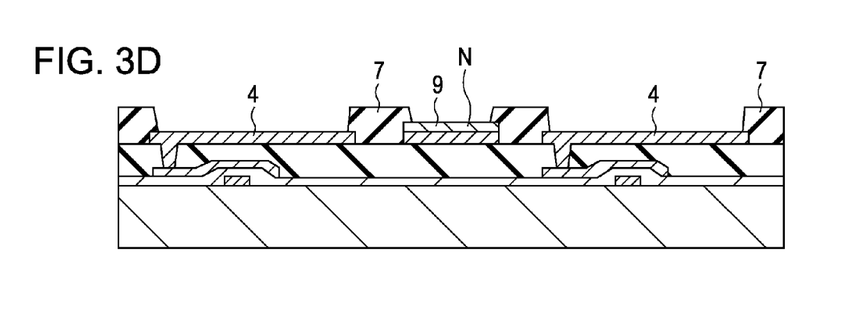

As shown in FIG. 3D, the insulating pattern 7 in the shape covering the perimeter of the lower electrode 4 is formed. An insulating film is formed from an organic material or a silicon based inorganic material and, thereafter, the insulating pattern 7 is formed by a photolithography step. At this time, the insulating pattern 7 is formed to take on the shape which covers the perimeters of the lower electrodes 4 in such a way as to expose the center portion and which exposes at least the light absorption layers 9 of the auxiliary wiring N. The insulating pattern 7 may cover other portion of the auxiliary wiring N as long as at least a part of the light absorption layer 9 is exposed. Alternatively, the entire portion of the auxiliary wiring N may be exposed.

Figure 4E:
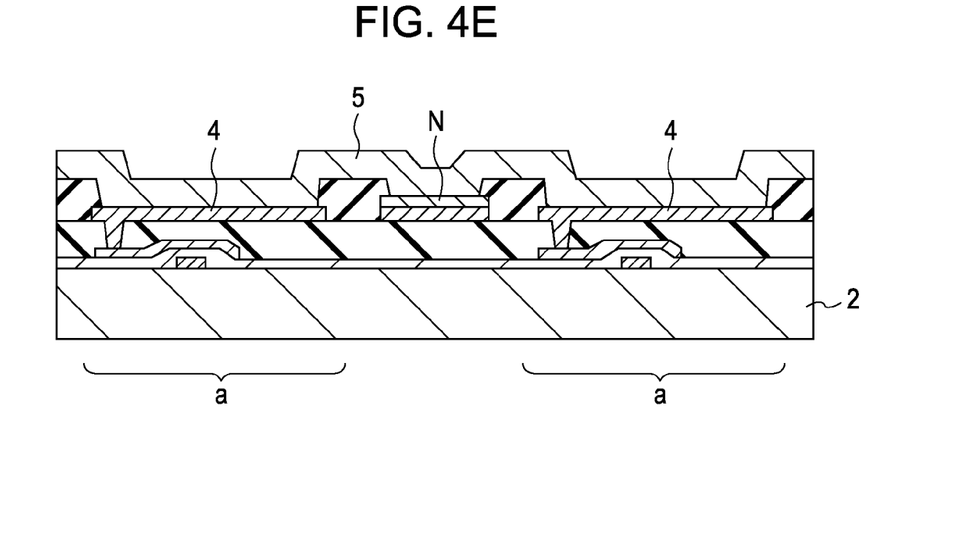
FIGS. 4E and 4F are sectional step diagrams showing the method for manufacturing a display device according to the first embodiment.

As shown in FIG. 4E, the organic layer 5 is formed while covering the entire surface of the substrate 2. The organic layer 5 is provided with at least an organic light emitting layer, and is formed to have a laminated structure in which a plurality of layers are formed sequentially. A material for constituting the organic layer 5 may be the same as the materials for the organic layers of general organic electroluminescent elements. The film formation method may be appropriately selected from general film formation methods, e.g., an evaporation method, a CVD method, a printing method, and an ink jet method, depending on the material to be used. For example, evaporation film formation is conducted for a low-molecular material.

The organic layer 5 is not limited to be formed covering all over the surface of the substrate 2, but may be formed by patterning on a pixel a basis. However, since the organic layer 5 is desired to completely cover the lower electrode 4, the organic layer 5 is formed in such a way as to extend on the insulating pattern 7 and the auxiliary wiring N, even in such a case.

Figure 4F:
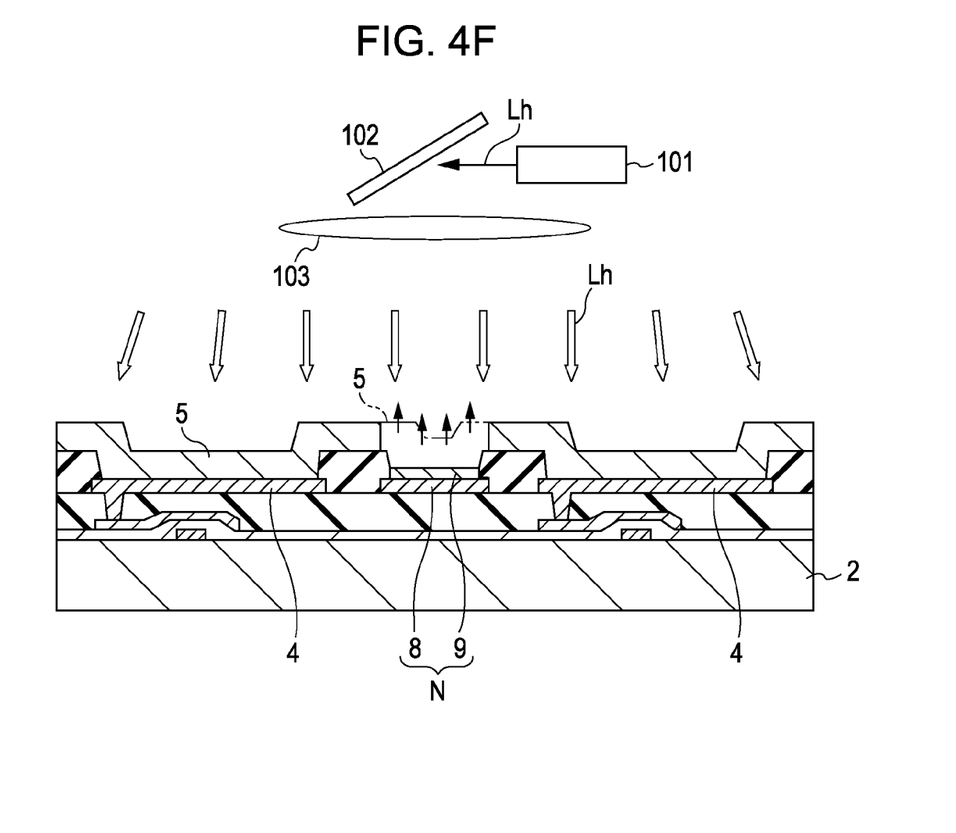

As shown in FIG. 4F, the laser light Lh is applied from above the organic layer 5. The laser light Lh is converted to heat in the light absorption layer 9 under the organic layer 5 and, thereby, a part of the organic layer 5 disposed above the light absorption layer 9 is selectively removed. At this time, it is important to apply the laser light Lh with a wavelength, at which the light absorption layer 9 constituting the auxiliary wiring N exhibits high absorption and the lower electrode 4 configured by using the highly electrically conductive layer 9 exhibits poor absorption. Furthermore, the laser light Lh is applied at such an amount of irradiation that the organic layer 5 located above the light absorption layer 9 is removed by the heat converted in the light absorption layer 9.

Figure 5:
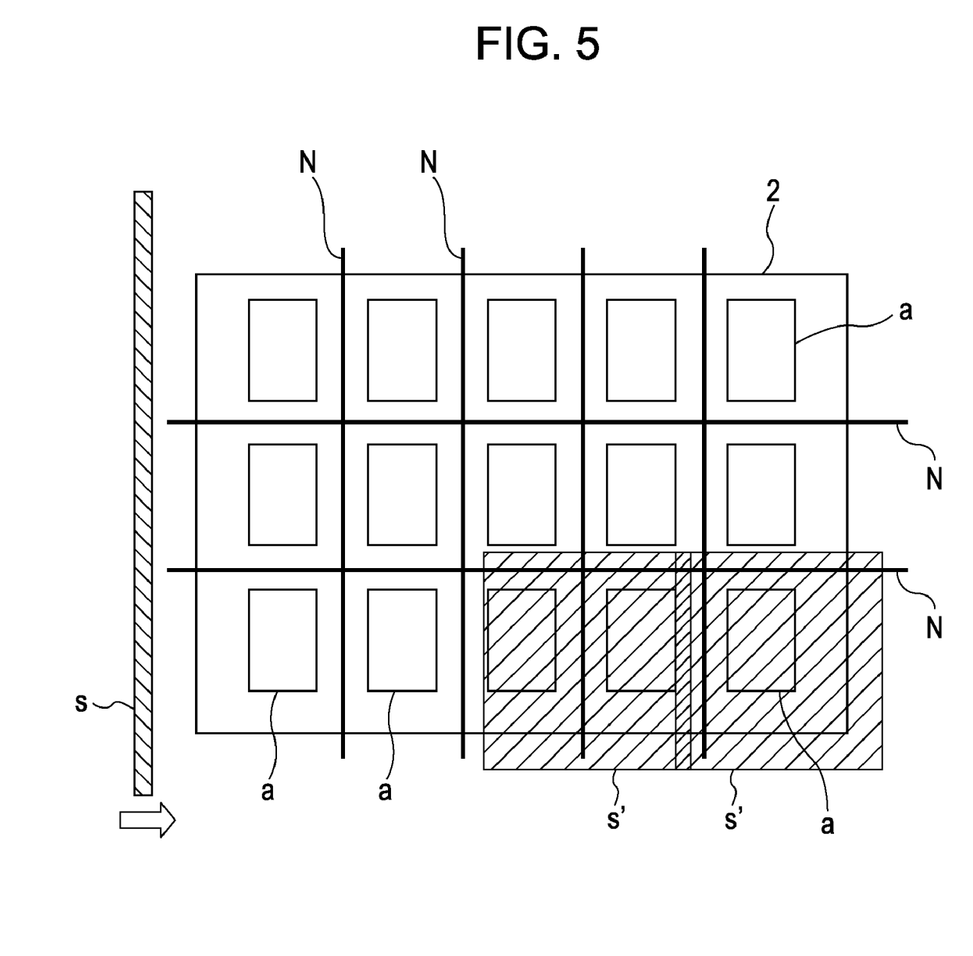
FIG. 5 is a diagram for explaining laser irradiation.

The above-described laser light Lh is applied over the entire surface of the substrate 2 unselectively. In this case, as shown in FIG. 5, the irradiation surface s of the laser light Lh may take on a long-length shape, and the long-length irradiation surface s may be moved in one direction along the auxiliary wiring N at a predetermined speed. Alternatively, the irradiation surface s' of the laser light Lh may take on a shape satisfactorily wider than the pixel a, and this wide irradiation surface s' may be subjected to step movement relative to the surface of the substrate 2.

In order to apply the above-described laser light Lh, as shown in FIG. 4F, a movable mirror (galvano mirror) 102 is disposed in an optical path of the laser light Lh emitted from an excitation light source 101, the movable mirror is moved at predetermined angles toward the substrate 2 and, thereby, the laser light Lh is applied to the surface side of the substrate 2 while the irradiation position is moved. The irradiation surface of the above-described laser light Lh is enlarged and shaped by a lens system 103 including an optical element (beam expander), disposed in the optical path of the light Lh reflected by the movable mirror 102. The lens system to shape the irradiation surface of the laser light Lh may be disposed additionally in between the excitation light source 101 and the movable mirror 102.

After the organic layer 5 portion on the light absorption layer 9 of the auxiliary wiring N is removed selectively, as described above, a film of the upper electrode 6 is formed from a material having a light transmission property while covering the entire surface of the substrate 2, as shown in the above-described FIG. 2. A transparent electrically conductive material, e.g., a thin metal film or ITO (indium tin oxide), is used as the material having a light transmission property. For example, the film of the upper electrode 6 is formed from a magnesium alloy here. The film formation of the above-described upper electrode 6 is conducted by an evaporation method, a sputtering method, a CVD method, or the like.

The above-described upper electrode 6 becomes in a state of being insulated from the lower electrode 4 due to the organic layer 5 and the insulating pattern 7. The upper electrode 6 becomes in a state of being connected to the light absorption layer 9 exposed at the portion, from which the organic layer 5 has been removed, of the auxiliary wiring N. Consequently, the organic electroluminescent element EL is formed, in which the organic layer 5 is held between the lower electrode 4 and the upper electrode 6.

After the above-described steps, although not shown in the drawing, a protective film is formed from silicon nitride (SiN), silicon oxide ($SiO_X$), or the like on the upper electrode 6 by a general sputtering method, CVD method, evaporation method, or the like, so that the display device 1 is completed.

According to the above-described manufacturing method of the first embodiment, as shown in FIG. 4F, the lower electrode 4 and the auxiliary wiring N disposed under the organic layer 5 have different configurations. That is, the light absorption layer 9 formed from the electrically conductive material having the light absorption coefficient higher than that of the lower electrode 4 is disposed in the auxiliary wiring N, and this light absorption layer 9 is exposed.

The laser light Lh is applied over the entire surface from the side of the organic layer 5 covering them. This laser light Lh is absorbed simply by the light absorption layer 9 so as to be converted to the heat. The organic layer 5 portion simply on the light absorption layer 9 constituting the auxiliary wiring N is removed selectively by the resulting heat. Consequently, the organic layer 5 on the light absorption layer 9 constituting the auxiliary wiring N may be selectively removed with high precision without causing misalignment relative to the auxiliary wiring N by applying the laser light Lh over the entire surface of the substrate 2 without using an expensive mask and without conducting alignment which takes much time and effort. As shown in FIG. 2, the upper electrode 6 may be connected simply to a portion, from which the organic layer 5 has been removed, of the auxiliary wiring.

As a result, it becomes possible to improve the yield and improve the productivity in the production of a display device 1 including the organic electroluminescent elements EL having a configuration in which a voltage drop of the upper electrode 6 is prevented by connecting the auxiliary wiring N.

In the above-described first embodiment, the auxiliary wiring N has a configuration in which the light absorption layer is exposed at the organic layer 5 side, and the organic layer 5 is partly removed by application of the laser light Lh from the organic layer 5 side, not from the substrate 2 side. Therefore, the influence of the laser light Lh may not be exerted on the pixel circuit including the thin film transistor Tr, disposed on the side nearer to the substrate 2 than is the lower electrode 4. That is, when the laser light Lh is applied from the substrate 2 side, if the pixel circuit including the thin film transistor Tr is composed of a material having the light absorption property, the photo-thermal conversion occurs in this material portion and the heat is generated. In this case, a portion of the organic layer 5 other than the portion on the auxiliary wiring N may be removed and, therefore, the target portion of the organic layer 5 on the auxiliary wiring N may not be removed selectively. However, according to the method of the present first embodiment, there may be no fear thereof.

Second Embodiment

Figure 6A:
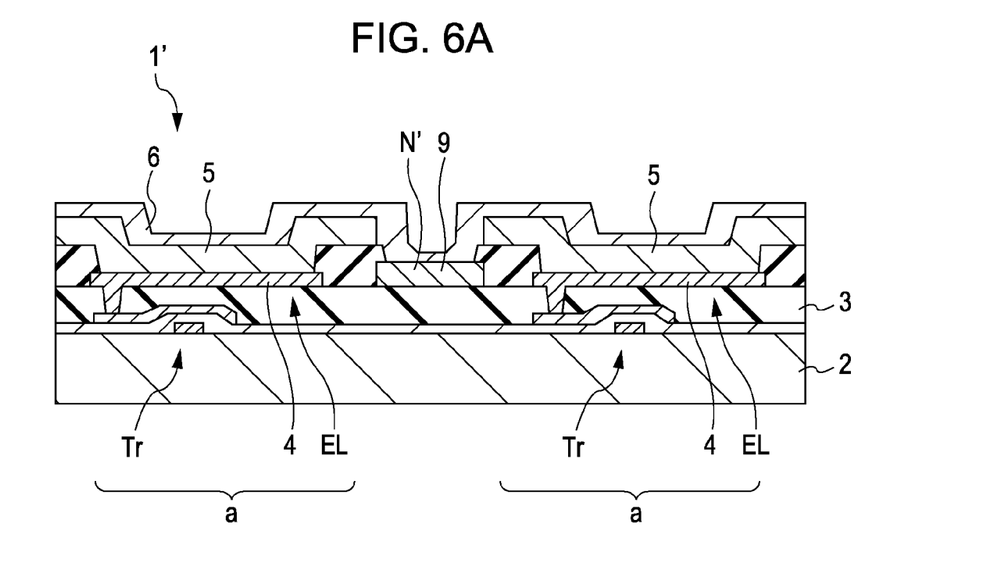
FIGS. 6A and 6B are schematic sectional views for explaining the configuration of a display device according to a second embodiment.
Figure 6B:
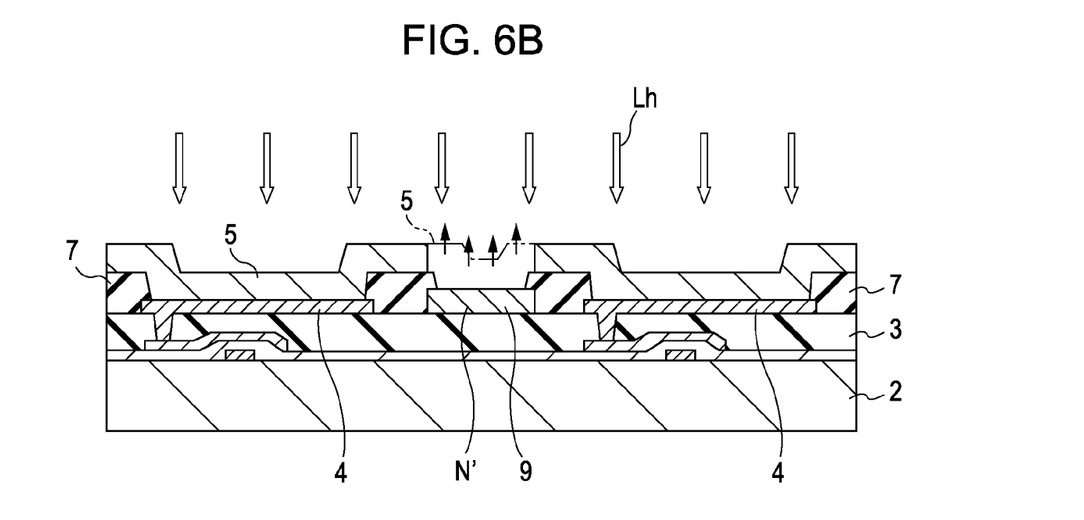

FIGS. 6A and 6B are schematic sectional views for explaining the configuration of a display device 1' according to the present second embodiment. FIGS. 6A and 6B are corresponding to a section II-II shown in the above-described FIG. 1. The display device 1' of the second embodiment shown in FIG. 6A is different from the display device 1 explained in the first embodiment in the configuration of the auxiliary wiring N', but the other configurations are the same.

The auxiliary wiring N' in the display device 1' is simply composed of a light absorption layer formed from a material having a light absorption property higher than that of the lower electrode 4 and a good photo-thermal conversion efficiency.

In the production of the display device 1' having the above-described configuration, as shown in FIG. 6B, the procedure up to the formation of the interlayer insulation film 3 is conducted as in the above-described first embodiment. Thereafter, the auxiliary wiring N' and the lower electrode 4 are formed individually on the interlayer insulation film 3 by patterning. At this time, in order to ensure the surface state of the lower electrode 4, it is preferable that the auxiliary wiring N' is formed by patterning and, thereafter, the lower electrode 4 is formed by patterning.

As in the first embodiment, an insulating pattern in the shape, in which at least a part of the auxiliary wiring N' composed of the light absorption layer 9 is exposed, is formed. An organic layer 5 is formed all over the surface and, thereafter, the laser light Lh is applied all over the surface from the organic layer 5 side. In this manner, the laser light Lh is converted to the heat in the auxiliary wiring N' composed of the light absorption layer 9 under the organic layer 5, and the organic layer 5 disposed above the auxiliary wiring N' is partly, selectively removed.

In the above-described second embodiment, the auxiliary wiring N' is composed of the light absorption layer 9 having the light absorption coefficient higher than that of the lower electrode 4, and the laser light Lh is applied all over the surface from the side of the organic layer 5 covering them. This laser light Lh is absorbed simply by the light absorption layer 9 so as to be converted to the heat. The organic layer 5 portion simply on the light absorption layer 9 constituting the auxiliary wiring N' is removed selectively by the resulting heat. Consequently, as in the first embodiment, the organic layer 5 on the auxiliary wiring N' may be selectively removed with high precision without causing misalignment relative to the auxiliary wiring N' by applying the laser light Lh all over the surface of the substrate 2 without using an expensive mask and without conducting alignment which takes much time and effort. Furthermore, it becomes possible to improve the yield and improve the productivity in the production of a display device 1' including the organic electroluminescent elements EL having a configuration in which a voltage drop of the upper electrode 6 is prevented by connecting the auxiliary wiring N'.

Third Embodiment

Figure 7A:
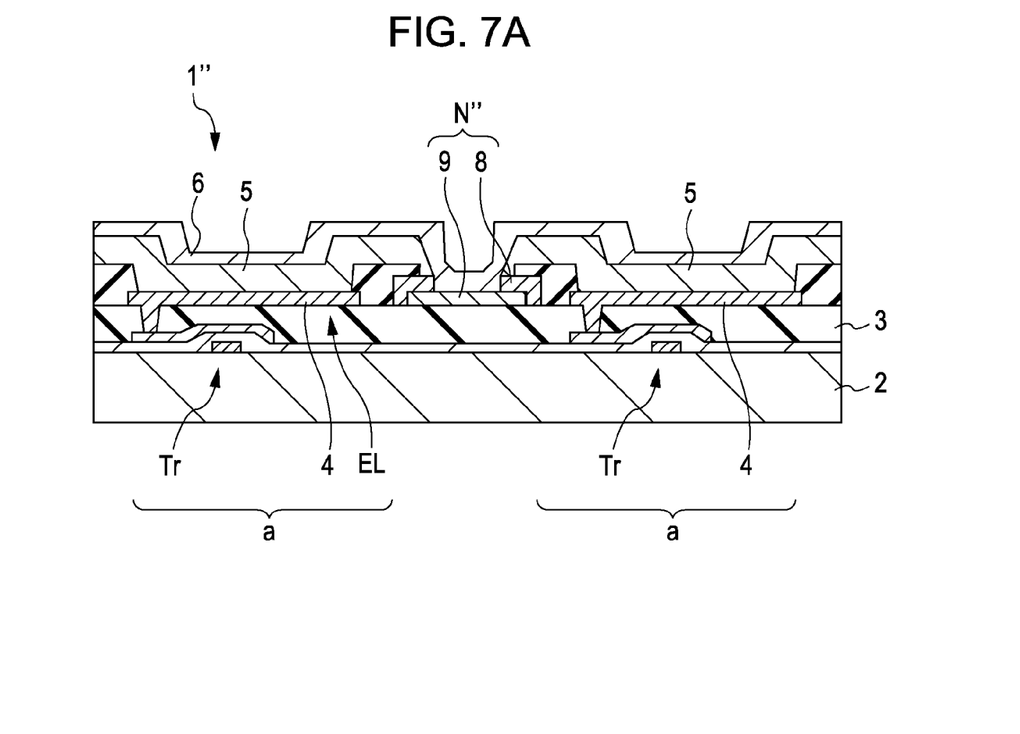
FIGS. 7A and 7B are schematic sectional views for explaining the configuration of a display device according to a third embodiment.
Figure 7B:
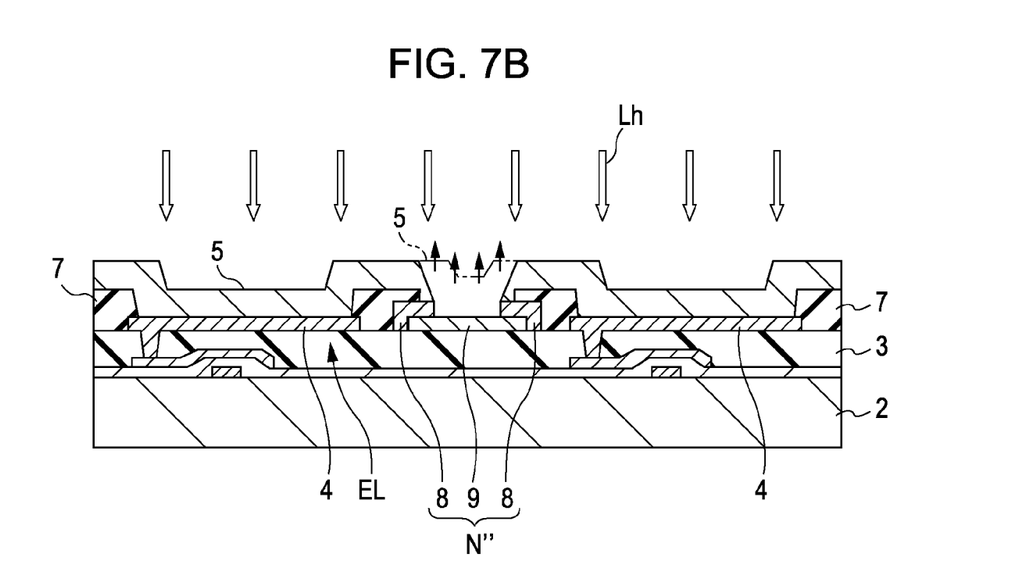

FIGS. 7A and 7B are schematic sectional views for explaining the configuration of a display device 1" according to the present third embodiment. FIGS. 7A and 7B are corresponding to a section II-II shown in the above-described FIG. 1. The display device 1" of the third embodiment shown in FIG. 7A is different from the display device 1 explained in the first embodiment in the configuration of the auxiliary wiring N", but the other configurations are the same.

The auxiliary wiring N" in the display device 1" has a configuration in which a highly electrically conductive layer 8 formed from the same material as that for the lower electrode 4 is disposed on a light absorption layer 9 and the light absorption layer 9 is exposed at a portion, from which the highly electrically conductive layer 8 has been removed.

In the production of the display device 1" having the above-described configuration, as shown in FIG. 7B, the procedure up to the formation of the interlayer insulation film 3 is conducted as in the above-described first embodiment. Thereafter, the light absorption layer 9 of the auxiliary wiring N" is formed by patterning. Subsequently, the lower electrode 4 and the highly electrically conductive layer 8 constituting the auxiliary wiring N" are formed by patterning on the interlayer insulating film 3 provided with the light absorption layer 9. At this time, it is important that the auxiliary wiring N" is composed of the light absorption layer 9 and the highly electrically conductive layer 8 and the light absorption layer 9 is exposed at a portion, from which the highly electrically conductive layer 8 has been removed.

As in the first embodiment, an insulating pattern 7 is formed while taking on the shape, in which at least a part of the light absorption layer 9 constituting the auxiliary wiring N" is exposed. An organic layer 5 is formed all over the surface and, thereafter, the laser light Lh is applied all over the surface from the organic layer 5 side. In this manner, the laser light Lh is converted to the heat in the light absorption layer 9 constituting the auxiliary wiring N" under the organic layer 5, and the organic layer 5 disposed above the light absorption layer 9 is partly, selectively removed.

In the above-described third embodiment, as in the first embodiment, the auxiliary wiring N" is configured by using the light absorption layer 9 having the light absorption coefficient higher than that of the lower electrode 4, and the laser light Lh is applied all over the surface from the side of the organic layer 5 covering them. This laser light Lh is absorbed simply by the light absorption layer 9 so as to be converted to the heat. The organic layer 5 portion simply on the light absorption layer 9 constituting the auxiliary wiring N" is removed selectively by the resulting heat. Consequently, as in the first embodiment, it becomes possible to improve the yield and improve the productivity in the production of a display device 1" including the organic electroluminescent elements EL having a configuration in which a voltage drop of the upper electrode 6 is prevented by connecting the auxiliary wiring N".

Since the auxiliary wiring N" has a configuration in which the highly electrically conductive layer 8 is disposed on the light absorption layer 9, the light absorption layer 9 is not patterned on the lower electrode 4 formed together with the highly electrically conductive layer 8 in the same step. Consequently, the surface state of the lower electrode 4 is ensured. Since the auxiliary wiring N" is composed of the light absorption layer 9 as well as the highly electrically conductive layer 8, the resistance value of the auxiliary wiring N" may be reduced.

In each of the above-described embodiments, the light absorption layer is formed as the same layer with the lower electrode. However, even in the case where the light absorption layer is not formed as the same layer with the lower electrode, a similar effect may be exerted. That is, the light absorption layer formed from a material having a photo-thermal conversion efficiency higher than that for the lower electrode may be disposed while being exposed at a substrate, and a part of the organic film may be selectively removed by the light irradiation from above the organic film formed above the light absorption layer. For example, the light absorption layer may be formed as the same layer with TFTs and be exposed at the substrate surface.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
    a substrate;
    a plurality of organic electroluminescent elements including an organic layer held between a lower electrode and an upper electrode disposed on the substrate, the lower electrode disposed by patterning in each pixel on the substrate; and
    an auxiliary wiring including a light absorption layer formed from an electrically conductive material having a light absorption coefficient higher than that of the lower electrode, the auxiliary wiring being disposed between pixels on the substrate;
    wherein the organic layer is disposed on the substrate including the lower electrodes and the auxiliary wiring, covers the lower electrodes, and exposes the light absorption layer portion of the auxiliary wiring;
    wherein the upper electrode is connected to the light absorption layer constituting the auxiliary wiring and is exposed at the organic layer, and
    wherein the organic layer is held between the lower electrodes and the upper electrode.

2. The display device of claim 1, wherein the auxiliary wiring comprises the light absorption layer.

3. The display device of claim 1, wherein the auxiliary wiring comprises:
    (a) the light absorption layer; and
    (b) an electrically conductive layer formed from a material having an electrical conductivity higher than the electrical conductivity of the light absorption layer.

4. The display device of claim 3, wherein the electrically conductive layer comprises the same material as that for the lower electrode.

5. The display device of claim 1, wherein the substrate comprises pixel circuits connected to the lower electrodes.

6. The display device of claim 1, wherein the upper electrode has a light transmission characteristic.

* * * * *